United States Patent
Dickel et al.

(10) Patent No.: US 6,628,794 B1
(45) Date of Patent: Sep. 30, 2003

(54) METHOD AND APPARATUS FOR LEVEL LIMITATION IN A DIGITAL HEARING AID

(75) Inventors: Thomas Dickel, Buttenheim (DE); Benno Knapp, Erlangen (DE); Hartmut Ritter, Neunkirchen (DE)

(73) Assignee: Siemens Audiologische Technik GmbH, Erlangen (DE)

(*) Notice: Subject to any disclaimer, the term of this patent is extended or adjusted under 35 U.S.C. 154(b) by 197 days.

(21) Appl. No.: 09/723,014

(22) Filed: Nov. 27, 2000

(30) Foreign Application Priority Data

Nov. 26, 1999 (DE) .................................. 199 57 128

(51) Int. Cl.[7] .................................................. H04R 25/00
(52) U.S. Cl. ...................................... 381/316; 381/317
(58) Field of Search ............................... 381/312, 314, 381/316, 317, 318, 320, 321, 324

(56) References Cited

U.S. PATENT DOCUMENTS

| | | | | |
|---|---|---|---|---|
| 4,187,413 A | * | 2/1980 | Moser | 381/312 |
| 4,303,803 A | * | 12/1981 | Yatsuzuka | 381/312 |
| 4,508,940 A | * | 4/1985 | Steeger | 381/312 |
| 4,674,104 A | * | 6/1987 | Bachtiger | 381/312 |
| 5,448,644 A | * | 9/1995 | Pfannenmueller et al. | 381/312 |
| 6,173,062 B1 | * | 1/2001 | Dibachi et al. | 381/312 |

FOREIGN PATENT DOCUMENTS

| | | |
|---|---|---|
| DE | 41 25 379 C1 | 10/1992 |
| DE | 197 28 482 C1 | 2/1999 |
| EP | 0 656 737 B1 | 1/1998 |

* cited by examiner

Primary Examiner—Rexford Barnie
(74) Attorney, Agent, or Firm—Schiff Hardin & Waite

(57) ABSTRACT

For level limitation of a time-discrete signal in a digital hearing aid having at least an input transducer, an A/D converter, a signal processing unit and an output transducer, the sampling rate of the time-discrete signal is boosted in the signal path following the A/D conversion and signal values of the time-discrete signal with a boosted sampling rate are limited to a maximum value. Harmonics that arise upon limitation of the signal values that are folded back into the audible frequency range are thus suppressed.

9 Claims, 3 Drawing Sheets

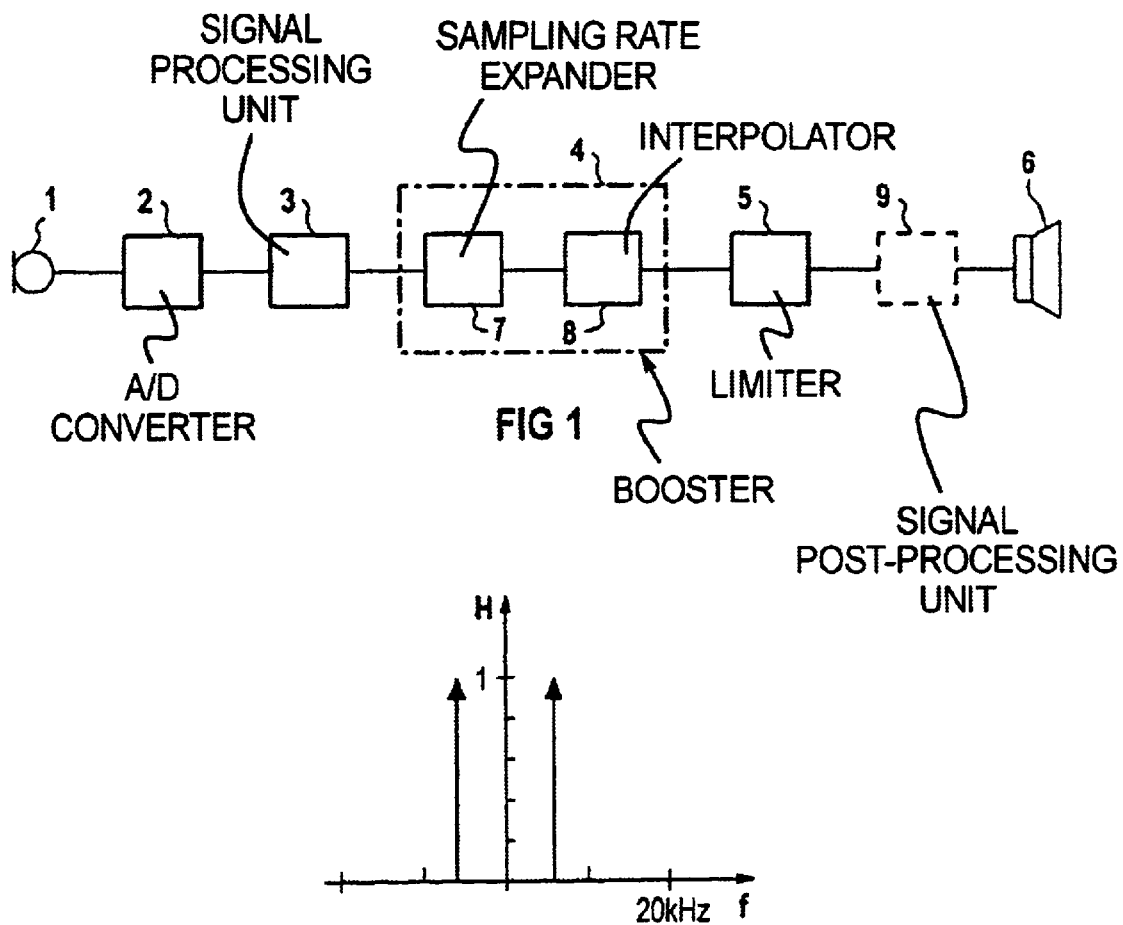
FIG 1
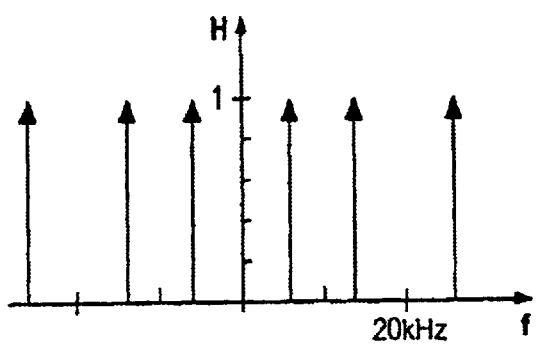
FIG 2
FIG 3

METHOD AND APPARATUS FOR LEVEL LIMITATION IN A DIGITAL HEARING AID

BACKGROUND OF THE INVENTION

The invention is directed to a method for level limitation of a time-discrete signal in a digital hearing aid comprising at least one input transducer, an A/D converter, a signal processing unit and an output transducer. The invention is also directed to a digital hearing aid for the implementation of the method.

A hearing aid user whose hearing is supplied with unusual sound events via a hearing aid can find this unpleasant, even painful. Such an unusual sound event can, for example, be the noise of a motor that begins suddenly. For limiting the output acoustic pressure, it is therefore necessary to limit the output level. For this purpose, a discomfort threshold is determined when fitting the hearing aid. The hearing aid is then set such that an adjustable, maximum output acoustic pressure is not exceeded even given extremely loud input signals. The hearing aid comprises a unit for level limitation (peak clipping) for this purpose. Such a hearing aid is disclosed, for example, by DE 41 25 379 C1. The system for level limitation deriving therefrom are implemented in analog circuit technology.

DE 197 28 482 C1 discloses a circuit for dividing a signal into a plurality of sub-signals, whereby core filters having double the sampling rate are employed in order to achieve an identical edge steepness to preceding stages.

EP 0 656 737 B1 discloses a hearing aid with digital signal processing. Therein, a digital unit for level limitation are provided between the A/D converter and the D/A converter. The values of a digital signal are thereby set to an adjustable maximum value before the D/A conversion. This results in distortions of the signal occurring in the following D/A conversion and non-harmonic signal parts arising in the audible frequency range.

SUMMARY OF THE INVENTION

An object of the invention is to specify a method for improving the sound quality in a digital hearing aid unit with digital level limitation. A further object of the invention is to design a digital hearing aid unit with a digital level limitation such that an improvement of the sound quality can be achieved.

According to the method and apparatus of the invention for a level limitation of a time-discrete signal in a digital hearing aid, at least one input transducer, an A/D converter in which an input signal is sampled with a specific sampling rate, a signal processing unit, and an output transducer are provided. The sampling rate of the time-discrete signal is boosted in a signal path following the A/D converter. Signal values of the time-discrete signal with the boosted sampling rate are limited to an adjustable maximum value.

When a signal is limited strictly to a maximum value, i.e. all signal values that exceed this maximum value are equated with the maximum value, then the Fourier analysis of the resulting signal shows that the fundamental is attenuated and harmonica are attached. For example, the following applies to the signal f'(t) that proceeds from the analog signal $f(t)=\sin \omega_0 t$ by clipping at +/−0.5:

$$f'(t)=0.61 \sin \omega_0 t+0.14 \sin 3\omega_0 t+0.02 \sin 5\omega_0 t+ \ldots$$

The spectrum of the analog signal periodically repeats with the sampling frequency given the presentation of the digitalized signal in the frequency domain. As a result thereof, it is possible that the spectra of the limited signal and of its periodic continuations overlap, even when the Nyquist criterion is met in the sampling for the original signal. In particular, the signal part of the first harmonic ($0.14 \sin 3\omega_0 t$ in the above example) leads to audible distortions since this cannot be neglected compared to the fundamental. The following comments thus particularly relate to a reduction of the effects of the first harmonic but can also be expanded to harmonics of a higher order given the same procedure.

According to the invention, the sampling rate is raised given the digitalized signal with limited signal values (oversampling). As a result thereof, the fundamental spectrum of this signal and its periodic continuations move far apart. The increase in the sampling rate occurs such that spectral components of disturbing harmonics no longer extend into the relevant range of the fundamental spectrum.

Particularly given an A/D-converted acoustic output signal of at least one microphone, the limitation of the signal values occurs to a maximum value in the case of the invention. This thus effects a change of the spectrum of the signal. The fundamental spectrum of the resulting signal is no longer band-limited; however, the signal strength drops with increasing frequency, so that the fundamental spectrum can also continue to be viewed as band-limited.

Advantageously, the boost of the sampling rate of the time-discrete, acoustic signal occurs following a digital signal processing. The digital signal processing in the hearing aid unit thus essentially occurs with the "normal" clock frequency. This contributes such that the power consumption of the hearing aid having a level limitation of the invention is only insignificantly increased.

A system for boosting the sampling rate are known from the pertinent literature of the field, for example from Oppenheim, Schafer, "Zeitdiskrete Signalverarbeitung", Oldenburg 1992. A system for boosting the sampling rate of a time-discrete signal with a sampling rate expander as well as an interpolator proceed therefrom. The sampling rate expander effects an increase in the number of signal values of the time-discrete signal. The interpolator effects an approach of the signal having an increased number of signal values to the original signal curve. This approach can, for example, occur with a low-pass filtering. The approximation with a linear interpolator is in fact not as good but is simpler to realize. A number of other interpolators that can be utilized at this point are known in addition to the two that have been cited.

The fundamental spectrum of the resulting signal and its periodic continuations are respectively spaced from one another by the increased sampling frequency after the boost in the sampling rate has been carried out. The limitation of the digital signal values now occurs to a maximum value. Given a corresponding increase in the sampling frequency, disturbing spectral components now no longer occur in the fundamental spectrum.

According to a preferred version of the invention, the maximum value that limits the signal values is adjustable.

The hearing aid can thus be set to the individual discomfort threshold of the hearing aid user. The setting can occur during manufacture, during fitting, or can be carried by the hearing aid user. One version of the invention provides separate level limitations in a number of channels of a multi-channel hearing aid. Such a hearing aid thus allows the setting of different discomfort thresholds for different frequencies. The hearing aid can thus be adapted better to the individual hearing of the hearing aid wearer.

In a further version of the invention, a signal post-processing unit is provided in the signal path following the unit for limiting the signal values to a maximum value. This, for example, can comprise a low-pass filter or a D/A converter. Due to the lower clock, however, the digital processing in a hearing aid should essentially occur in the signal processing unit.

Further details and advantages of the invention are explained in greater detail below with reference to the exemplary embodiments shown in the drawing.

BRIEF DESCRIPTION OF THE DRAWINGS

FIG. 1 shows the block circuit diagram of a hearing aid according to the invention;

FIG. 2 illustrates the spectrum of an analog signal;

FIG. 3 illustrates the spectrum of a digitalized signal;

DESCRIPTION OF THE PREFERRED EMBODIMENTS

Figure 4:
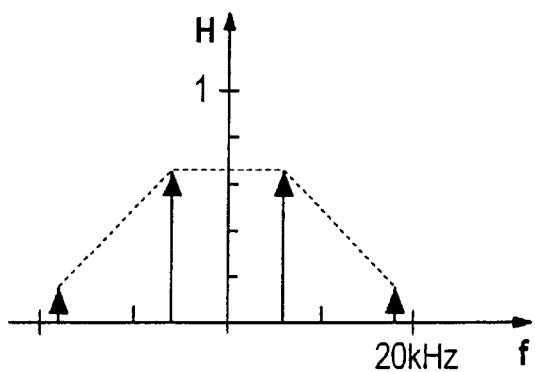
FIG. 4 shows the spectrum of a level-limited, analog signal.

FIG. 1 shows the block circuit diagram of a hearing aid of the invention. An acoustic-electrical input transducer 1 serves for the pickup of an acoustic signal. This is digitalized by an A/D converter 2. The acoustic signal thus assumes discrete values between a minimum value and a maximum value. The digital signal processing in the hearing aid essentially occurs in a signal processing unit 3. In order to prevent levels that the hearing aid user finds unpleasant or painful from occurring at the output transducer 6 of the hearing aid, the hearing aid has a limiter 5 for limiting the signal values. The maximum value to which the signal values are limited is adjustable. The setting can, for example, occur when fitting the hearing aid. When the digital signal at the output of the signal processing unit 3 is strictly limited to a maximum value, then this leads to audible distortions of the signal. In order to reduce these distortions, a booster 4 for boosting the sampling rate is connected between the signal processing unit 3 and limiter 5 for a limitation of the signal values given the hearing aid means of the invention. In the exemplary embodiment, the booster 4 for boosting the sampling rate is composed of a sampling rate expander 7 and of an interpolator 8. The sampling rate expander 7 dependent on the value of the boosted sampling rate—inserts a plurality of new signal values between two neighboring, original signal values. The interpolator 8 provides an approximation of the signal with boosted sampling rate to the signal curve of the original signal. The interpolator 8 can, for example, be implemented as a linear interpolator or as a low-pass filter. When the signal with the boosted sampling rate is then supplied at the output of the interpolator 8 to the limiter 5 for limiting the signal values, then the audible distortions in the output signal are significantly reduced compared to a hearing aid without boost of the sampling rate.

The functioning is explained below with reference to the example of a sine signal: f=6 kHz that is sampled with a sampling frequency $f_a$=20 kHz. The spectrum of the analog signals with the two spectral lines at ±6 kHz is shown in FIG. 2. FIG. 3 shows the spectrum of the function sampled with 20 kHz. The periodic continuation of the original spectrum can be seen from the Figure. When the analog function is limited at ±0.5, then the spectrum shown in FIG. 4 results. In addition to the fundamental, only the first harmonic with the amplitude 0.14 at triple the frequency of the original signal can be seen from the drawing. Higher harmonics are not shown due to the lower amplitude values.

Figure 5:
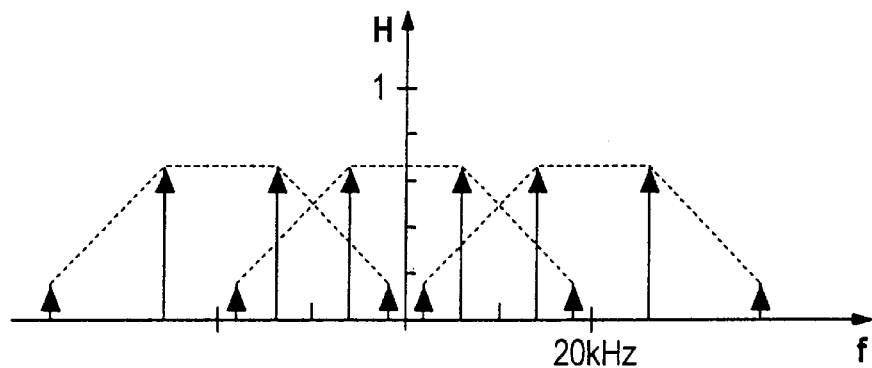
FIG. 5 shows the spectrum of a level-limited, digitalized signal.

FIG. 5 shows the spectrum of the limited signal sampled with 20 kHz. It becomes clear from the Figure that the spectral parts of the periodic continuation of the fundamental spectrum extend into the fundamental spectrum. They lead to the disturbances in the audible range.

Figure 6:
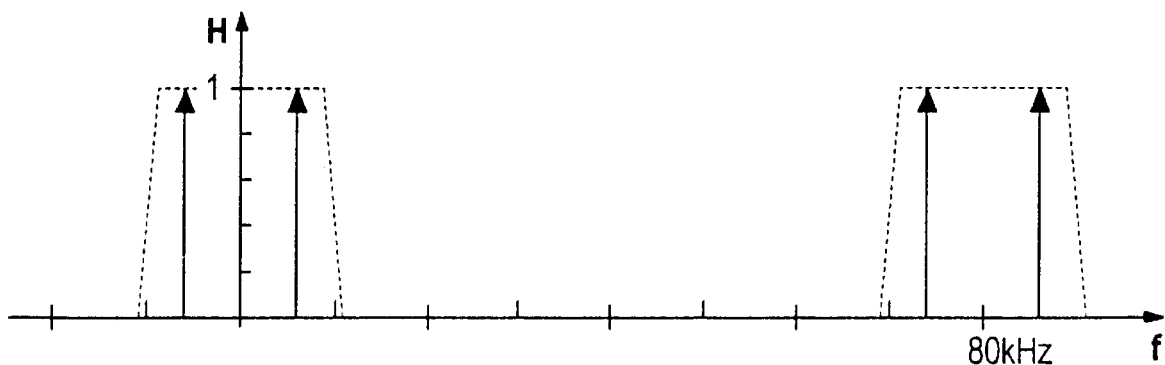
FIG. 6 illustrates a digitalized signal after the boost in the sampling rate and the low-pass filtering.
Figure 7:
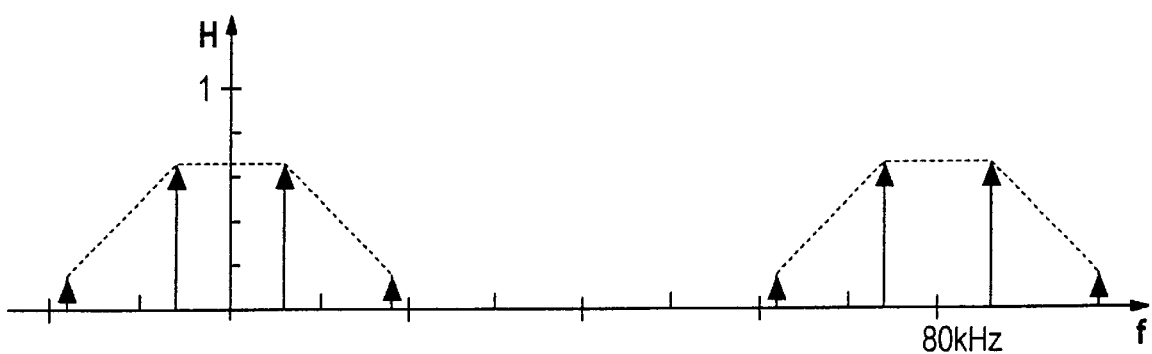
FIG. 7 illustrates a level-limited signal with boosted sampling rate.

FIG. 6 shows the spectrum of the signal following the boost of the sampling rate at the output of the interpolator 8. The sampling rate now amounts to 80 kHz. The fundamental spectrum of this signal and its periodic continuations are thus respectively likewise spaced by 80 kHz from one another. When the signal values are now limited to ±0.5, then the spectrum shown in FIG. 7 results. As can be derived from the Figure, the harmonics of the periodic continuations of the fundamental spectrum are no longer folded back into the fundamental spectrum. The disturbances proceeding from FIG. 5 have thus been eliminated.

Although various minor modifications might be suggested by those skilled in the art, it should be understood that our wish to embody within the scope of the patent warranted hereon all such modifications as reasonably and properly come with the scope of our contribution to the art.

We claim:

1. A method for level limitation of a time-discrete signal in a digital hearing aid, comprising the steps of:

providing at least one input transducer connecting to an A/D converter which in turn connects to a signal processing unit which outputs a time-discrete signal, said time-discrete signal being connected through a booster which outputs to a limiter, and an output of the limiter being fed to an output transducer;

boosting a sampling rate of said time-discrete signal with said booster in order to reduce distortions which would otherwise result when limiting said time-discrete signal with said limiter; and limiting values of said boosted sampling rate time-discrete signal with said limiter to an adjustable maximum value.

2. The method according to claim 1 including the steps of providing said booster as a sampling rate expander which inserts a plurality of new signal values between neighboring original signal values, and which is followed by an interpolator which provides an approximation of the boosted sampling rate signal to a signal curve of an original signal.

3. The method according to claim 2 wherein the interpolator comprises a linear interpolator.

4. The method according to claim 2 wherein the interpolator comprises a low-pass filter.

5. A digital hearing aid, comprising:

an input transducer;

an A/D converter connected following the input transducer;

a signal processing unit connected following the A/D converter and which outputs a time-discrete signal;

a booster for boosting a sampling rate for the time-discrete signal in order to reduce distortions which would result from limiting signal values of the time-discrete signal if the booster were not provided;

a limiter for limiting the time-discrete signals with the boosted sampling rate to an adjustable maximum value; and an output transducer connected following the limiter.

6. The digital hearing aid according to claim 5 wherein the booster comprises a sampling rate of expander.

7. The digital hearing aid according to claim 6 wherein the booster comprises an interpolator following the sampling rate expander.

8. The digital hearing aid according to claim 7 wherein the interpolator comprises a low-pass filter.

9. The digital hearing aid according to claim 7 wherein the interpolator comprises a linear interpolator.

* * * * *